United States Patent

Ouellette et al.

[11] Patent Number: 6,081,640
[45] Date of Patent: Jun. 27, 2000

[54] BROADBAND GRATING

[75] Inventors: Francois Ouellette, Dulwich Hill; Peter Krug, Willoughby; Ben Eggleton, Sydney; Peter Hill, Glenbrook, all of Australia

[73] Assignees: The University of Sydney; Telstra Corporation Limited, both of Sydney, Australia

[21] Appl. No.: 08/875,502
[22] PCT Filed: Feb. 1, 1996
[86] PCT No.: PCT/AU96/00048
  § 371 Date: Oct. 16, 1997
  § 102(e) Date: Oct. 16, 1997
[87] PCT Pub. No.: WO96/24079
  PCT Pub. Date: Aug. 8, 1996

[30] Foreign Application Priority Data

Feb. 3, 1995 [AU] Australia ................... PN0898

[51] Int. Cl.⁷ ........................... G02B 6/34
[52] U.S. Cl. ........................... 385/37
[58] Field of Search .................. 385/24, 31, 32, 385/33, 36, 37, 38, 39, 147

[56] References Cited

U.S. PATENT DOCUMENTS 5,309,260  5/1994  Mizrahi et al. ............ 385/37

FOREIGN PATENT DOCUMENTS 8601286  2/1986  WIPO .
9324977  12/1993  WIPO .

Primary Examiner—Akm E. Ullah
Attorney, Agent, or Firm—Ladas & Parry

[57] ABSTRACT

An optical device incorporating a grating structure and method of producing same. The grating structure is composed of higher and lower refractive index regions which are positioned periodically with period P, wherein at least one of an amplitude, a phase, and a spatial frequency of the grating structure varies periodically with period L, and wherein at least one of the period L and the period P is chirped continuously over substantially the full extend of the grating structure.

19 Claims, 4 Drawing Sheets

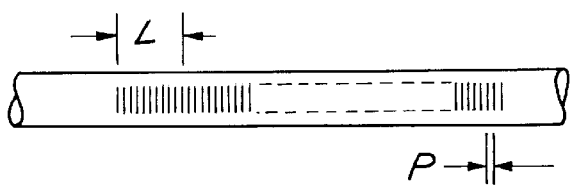
FIG. 5
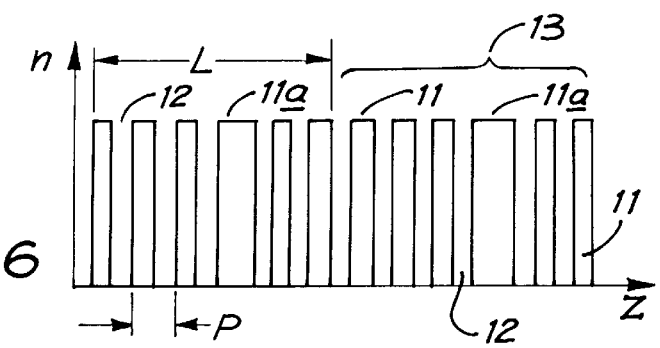
FIG. 6
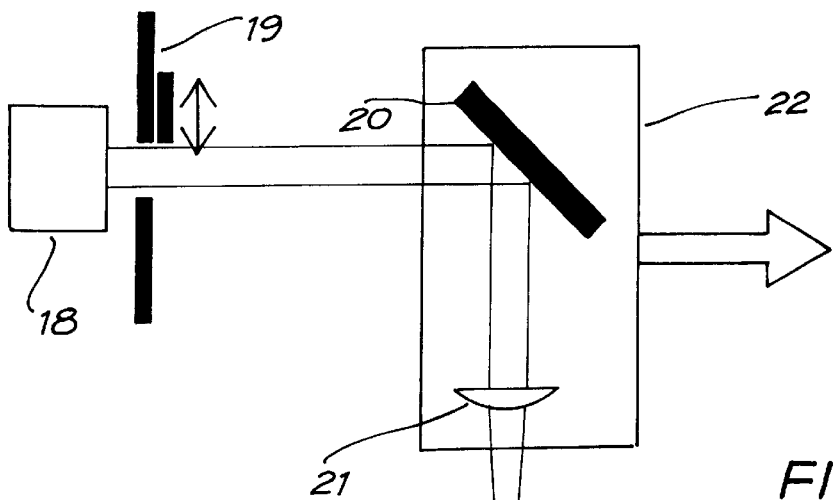
FIG. 7
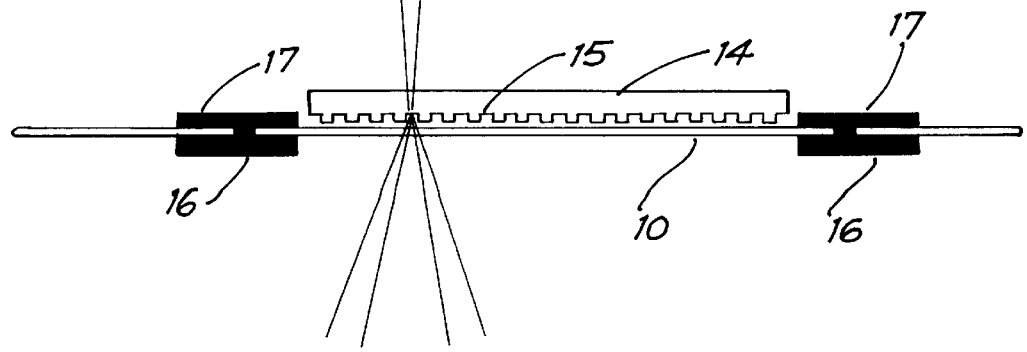

BROADBAND GRATING

FIELD OF THE INVENTION

This invention relates to broadband Bragg gratings and to a method of forming the gratings. The invention has particular application to in-fibre Bragg gratings and is hereinafter described in the context of a germano-silicate fibre, having a photosensitive core, but it will be understood that the invention does have broader application, for example to planar wave guides and other light transmitting devices in which gratings may be formed.

BACKGROUND OF THE INVENTION

Bragg gratings are conventionally employed as filters in optical communication systems. The gratings are formed with regions of differing (i.e., high and low amplitude) refractive index in the direction of light propagation and they reflect light over a spectral range $\delta\lambda_B$ centred on a wavelength $\lambda_B=2nP$ where $\lambda_B$=Bragg (centre) wavelength, n=effective (average) refractive index, and P=grating period.

The spectral region or bandwidth $\delta\lambda_B$ over which reflection occurs depends upon the strength of the grating (i.e., the amplitude or depth of refractive index modulation) and the length of the grating. In the case of a 10 cm long grating that is formed to provide a centre wavelength $\lambda_B$ of 1.55 μm, the reflection bandwidth would be in the order of 0.01 nm.

The above described Bragg gratings are employed conventionally as optical filters which, in being formed within optical fibres, exhibit low insertion loss, and as transducers in strain or temperature responsive sensor devices. Also the gratings when chirped are employed as dispersion compensators and function as such to reflect different spectral components of light from different axially spaced positions along the length of the grating.

Chirping has the effect of expanding the width of the reflection peak and is achieved by varying the periodicity of the grating in the direction (Z) of light propagation. The chirping may be linear in which the grating period $P=P_O+\alpha Z$ or non-linear in which case the grating period $P=P_O+\alpha Z^n$ for example.

One problem that is inherent in the above described gratings, including those that are chirped to exhibit an expanded spectral width, is that they cannot be tuned to a significant extent. However, it would be useful if a broadband grating of the described type could be produced for use in processing a single channel signal to facilitate a reduction in the degree of tuning required to match a source to the grating. This in turn would facilitate replacement of one source with another without there being a need for critical component matching. Another problem that is inherent in the known gratings is that they cannot be employed singly to perform filtering, dispersion compensation or other functions simultaneously on multiple channels at different wavelengths. In this respect it has been recognised by the inventors that it would be useful if a single grating could be employed to perform equivalent functions on multiple communication channels such as exist in wavelength division multiplexing (WDM) systems.

SUMMARY OF THE INVENTION

The present invention seeks to meet the above stated needs by providing a light transmitting device that comprises a Bragg grating which is formed in the direction of light propagation with grating regions of alternatingly high and low refractive index, the grating regions having periodicity P. Also, the grating regions are structured in a manner which varies periodically with a modulation period L>P, and either one or the other or both of the grating period P and the modulation period L is or are chirped over substantially the full extent of the grating.

The invention may also be defined in terms of a method of producing a broadband Bragg grating and which comprises forming grating regions of alternatingly high and low refractive index in the light transmitting device, the grating regions being formed in the direction of light propagation and having periodicity P. When forming the grating regions they are structured in a manner which varies periodically with a modulation period L>P, and chirping is imposed on either one or the other or both of the grating period P and the modulation period L over substantially the full extent of the grating.

The light transmitting device in which the grating is formed may comprise any device in which regions of differing refractive index may be created, but it preferably comprises an optical fibre.

The grating regions may be structured in a manner such that the amplitude and/or the phase and/or the periodicity of the grating regions is/are varied periodically (with modulation period L) along the length of the grating. That is, in one embodiment of the invention the amplitude of the high levels of refractive index may be modulated, whilst in a second embodiment of the invention the phase may be varied by introducing at least one discontinuity into each of the successive modulation periods. In a third embodiment of the invention, the periodicity of the grating regions may be varied within each successive modulation period L, in the manner of a sampled grating. In all three of the identified embodiments, the complete grating is chirped in terms of one or the other or both of the grating period P and the modulation period L. Thus, chirping of the complete grating is effected in addition to (i.e., at the same time as or subsequent to) the establishment of a periodic structure within the grating.

The grating period P will not be constant throughout the length of the grating and will vary due to chirping of the grating if for no other reason. However, the grating period P will not vary by a significant amount relative to the modulation period L and may be considered notionally as having a substantially constant value P<L.

In the case of a grating in which the periodicity of the grating regions is varied periodically, the grating may be considered as one in which each of the successive portions (i.e., periods) of the grating is structured as a chirped grating portion, with each of the successive portions being substantially identical and, but for chirping of the full grating length, having the same phase relationship.

A grating in which the phase is varied periodically may be achieved by introducing at least one discontinuity into each of the successive portions of the length of the grating, such as by interrupting the sequence of alternating high-low regions of refractive index in the direction of light propagation.

In the case of a grating in which the high level of the refractive index is varied periodically as to amplitude, modulation of the amplitude may be in the form of a smooth wave function, for example as a sine wave having a period L, or as a sawtooth waveform, but it preferably is applied as a square-wave function. The modulation may be partial or be applied for the full refractive index depth of the grating regions, and in the latter case would effectively create spaced-apart grating sections. This effect may be achieved by forming separate (periodic) grating sections, the sections being spaced apart in the Z direction and having period L, but it would be essential in such case to ensure that a constant phase relationship is maintained between the grating regions in the successive grating sections. This may, for example, be achieved by side-writing a length of grating by using UV radiation and a single phase mask which extends for the full length of the intended grating, and by discontinuing the writing of the grating during alternating periodic intervals along the Z direction of the mask.

The grating period P will typically be in the order of 0.20 to 0.60 μm, so that the reflected wavelengths will be in the range of 0.58 μm to 1.74 μm. The modulation period L will typically be in the order of 0.20 to 8.00 mm and most preferably will be in the order of 1.0 mm. When the amplitude of refractive index of the grating is 100% modulated by a square wave of period L to create spaced-apart grating sections, each grating section may have a length in the direction of light propagation in the order of 0.02 to 4.00 mm and preferably in the order of 0.1 mm.

As stated in the above definitions of the present invention, either or both of the grating period P and the modulation period L may be chirped, to produce different spectral responses. If the grating period P is chirped and the modulation period L is maintained constant (other than to the extent that it may be influenced to a small extent by chirping of the grating regions), the grating will exhibit a spectral response in which identical expanded (i.e., "chirped") reflection peaks having a spectral width $\delta\lambda$ appear at each side of an expanded ("chirped") reflection peak that is centred on the Bragg wavelength $\lambda_B$ and fall under an envelope determined by the Fourier transform of the periodic modulation function. The expanded reflection peaks at each side of the centre wavelength will be spaced apart from the centre reflection peak and from each other by the distance $\Delta\lambda$.

In an alternative grating in which the grating period P is maintained constant and the modulation period L is chirped, the grating will exhibit a spectral response in which non-identical expanded ("chirped") reflection peaks having respective spectral widths $\delta\lambda$ appear at each side of a narrow reflection peak centred on $\lambda_B$ and having spectral width $\delta\lambda_B$.

In the further alternative form of the grating, in which both the grating period P and the modulation period L are chirped, the grating will exhibit a spectral response in which non-identical expanded ("chirped") reflection peaks having respective spectral widths $\delta\lambda$ appear at each side of an expanded ("chirped") reflection peak having spectral width $\delta\lambda$ centred on $\lambda_B$.

Chirping of the grating period P and the modulation period L may be effected in any known manner, for example during side-writing of the grating or, following writing of the grating, by subjecting the grating to a post-formation chirping procedure as known in the art. Thus, chirping may be achieved by application of strain differentially along the length of the grating, by applying loading to a previously tapered fibre core, by application of heat to establish a temperature gradient along the length of the grating or by modification of the structure of the grating by application of any one of the known techniques for inducing the stress optic effect.

The grating as above defined may be structured further by varying the amplitude of the high levels of refractive index over the full length of the grating, in addition to establishment of the periodic structure. For example, a Gaussian envelope may be imposed on the grating regions over the full length of the grating for the purpose of smoothing the spectral response.

The grating in its various possible forms may be used in various optical circuits, for example to provide for dispersion compensation at multiple wavelengths.

Thus, the invention may be defined further as providing an optical communication system comprising an optical transmitter which is arranged to transmit light having a centre wavelength $\lambda$ and bandwidth $\delta\lambda$, a receiver arranged to receive the transmitted light, and a light transmitting medium connecting the transmitter and the receiver. A grating of the type as above defined, which exhibits multiple reflection peaks, is located in circuit with the light transmitting medium and the grating is selected such that one of its reflection peaks has a centre wavelength that coincides with the transmitter wavelength $\lambda$ and has a bandwidth at least equal to the bandwidth $\delta\lambda$.

In the above defined system the wavelength of a replacement light source may effectively be tuned to that of the remainder of the system, provided that the amount of tuning required is not greater than one-half of the spectral separation between the reflection peaks of the grating.

In a particular application of the invention, the above defined optical communication system may comprise an optical transmitter which is arranged to transmit multi-channel light having centre wavelengths $\lambda_1, ---, \lambda_n$ and channel band widths $\delta\lambda_1, ---, \delta\lambda_n$, a receiver arranged to receive the transmitted light, and a light transmitting medium connecting the receiver and the transmitter. A grating of the type as above defined, which exhibits multiple reflection peaks, is located in circuit with the light transmitting medium and is connected optically with means arranged to direct light into the grating from a first portion of the light transmission medium, to receive reflected light from the grating and to direct the reflected light into a second portion of the light transmitting medium. The grating is selected such that its reflection peaks coincide with the centre wavelength $\lambda_1, ---, \lambda_n$ and have spectral widths not less than the respective channel bandwidths $\delta\lambda_1, ---, \delta\lambda_n$.

The invention will be more fully understood from the following description of three exemplary embodiments of in-fibre Bragg broadband gratings and from the description of a preferred method and apparatus for producing the gratings within optical fibres. The description is provided with reference to the accompanying drawings.

BRIEF DESCRIPTION OF THE DRAWINGS

In the drawings—

FIG. 5 shows on an enlarged scale a portion of an optical fibre incorporating a grating in accordance with a third embodiment of the invention, FIG. 6 shows a graphical representation of two sections of the grating shown in FIG. 5, FIG. 7 shows an apparatus used in side writing a length of the optical fibre shown in FIG. 1.

DETAILED DESCRIPTION OF MODES OF THE INVENTION

The optical fibre 10 that "carries" the various embodiments of the grating comprises a single mode boro-germano-silicate fibre and when formed is loaded with molecular hydrogen to increase its photosensitivity. This is achieved by "soaking" the fibre in a highly pressurised atmosphere of hydrogen at 70 atm at 70° C. for 24 hours.

Figure 1:
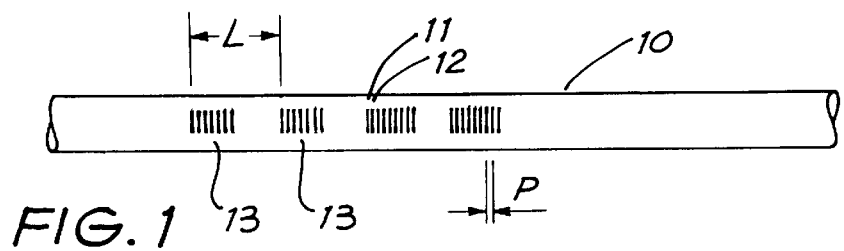
FIG. 1 shows on an enlarged scale a portion of an optical fibre incorporating a grating in accordance with a first embodiment of the invention.
Figure 2:
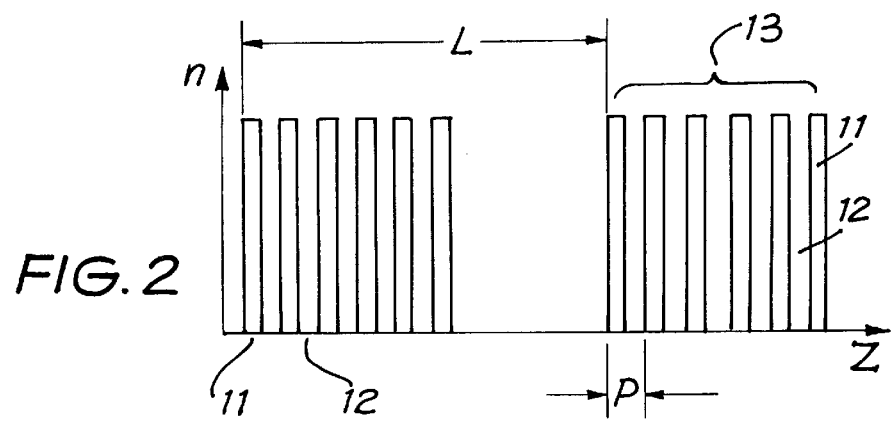
FIG. 2 shows a graphical representation of two sections of the grating as shown in FIG. 1.

The grating is written into the optical fibre 10 in the direction of light propagation through the fibre and, as shown in FIGS. 1 and 2, grating regions 11 and 12 of alternatingly high and low refractive index are formed in the optical fibre 10 with periodicity P. Also, the grating regions 11 and 12 are structured in a manner such that the amplitude of the high levels of refractive index is varied periodically with a modulation period L. The modulation of the amplitude might take the form of a smooth wave function or any other periodic form, but as illustrated in FIGS. 1 and 2 a 100% square wave modulation is applied to the grating regions so as to create spaced-apart grating portions or sections 13.

The grating period P will typically be in the order of 0.20 to 0.60 $\mu$m, depending upon the required reflection wavelength, but will vary along the length of the grating with chirping of the grating. The modulation period will typically be in the order of 0.20 to 8.00 mm. The length of each section 13 will typically be in the order of 0.1 mm and the total grating length will typically be in the order of 5 to 10 cm.

The grating 10 is chirped for its full length, by chirping the grating period P, the modulation period L or both the grating period and the modulation period. Which of these chirps is imposed will be dependent upon the spectral response required to be exhibited by the grating, this having been described in more detail earlier in the specification. Linear chirping is most preferably imposed on the grating, typically in the order of 0.03%.

Figure 3:
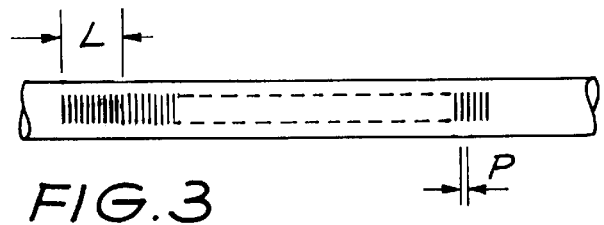
FIG. 3 shows on an enlarged scale a portion of an optical fibre incorporating a grating in accordance with a second embodiment of the invention.
Figure 4:
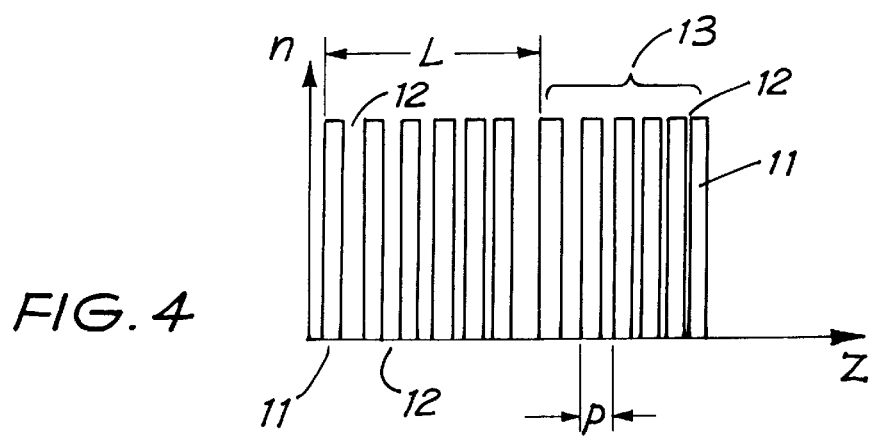
FIG. 4 shows a graphical representation of two sections of the grating shown in FIG. 3.

The grating which is shown in FIGS. 3 and 4 of the drawings is structured in a manner such that the periodicity of the grating regions is varied periodically with modulation period L. Each of the grating sections 13 incorporates grating regions 11 and 12 of alternatingly high and low refractive index, but the grating period P within each section 13 diminishes linearly with length of the grating section. Thus, each grating section may be considered as being separately chirped, typically in the order of 1.0% to 5.0%, in the manner of a sample grating, but further chirping is imposed on the grating over its full length.

The grating shown in FIGS. 3 and 4 will have a nominal grating period P in the order of 0.20 to 0.60 $\mu$m and will otherwise have dimensional characteristics similar to those which have been described above with reference to FIGS. 1 and 2.

The grating which is shown in FIGS. 5 and 6 of the drawings is structured in a manner such that the phase is varied by a discontinuity in each of the successive grating sections 13. Each of the grating sections 13 incorporates grating regions 11 and 12 of alternatingly high and low refractive index, with a grating period P, but a phase change is introduced by interrupting the sequence of alternating high-low regions of refractive index, for example by establishing consecutive regions 11a of high refractive index. Each section of the grating is identical and the sections are spaced by modulation period L.

The grating as shown in FIGS. 5 and 6 has dimensional characteristics similar to those described above with reference to FIGS. 1 to 4.

Although the various grating configurations have been described in the context of separate gratings, the grating regions of any one grating may be structured in a manner such that the amplitude and the phase, or the amplitude and the periodicity, or the phase and the periodicity are, in respective cases, both varied periodically with modulation period L.

Each of the above described gratings is written into the optical fibre 10 in the direction of light propagation through the fibre and, whilst various techniques may be employed for side-writing the grating, a phase mask 14 preferably is employed in the manner indicated in FIG. 7. The phase mask comprises a silica mask having 1 mm long parallel grooves 15 which are spaced apart with a period of 1.06 $\mu$m, assuming that the grating is to have a period P of 0.53 $\mu$m to produce a reflection peak centred on $\lambda_B$ of 1.55 $\mu$m. The grooves within the phase mask are etched to a depth of approximately 240 nm, and the grooves extend over a distance of 14 cm in the direction perpendicular to their length and, thus, in the direction of propagation of light through the grating. The phase mask 14 may be employed to produce a grating having a 10 cm length and, with the dimensions stated, is arranged to diffract UV light at 240 nm mostly in the +1 and −1 orders of diffraction.

The fibre 10 is stripped of its protective coating for a distance at least as long as the grating to be written (10 cm as described), and placed directly behind the phase mask 14 such that the axis of the fibre is perpendicular to the mask grooves 15. The fibre is laid in V-grooves 16 and is held by magnets 17, so that it is maintained under a slight tension.

A laser beam pulsed at 10 Hz, at a wavelength of 240 nm is generated by a frequency-doubled excimer-pumped dye laser 18 and is directed through a mechanical shutter 19. The laser beam is deflected by a mirror 10 and focused by way of a fused silica cylindrical lens 21 which is located with its axis perpendicular to the fibre axis, in such a way that the beam width on the fibre corresponds to the width of one section 13 of the grating. The lens 21 has a focal length of 20 cm and the lens is positioned at a-distance from the fibre selected to determine the required beam width.

The mirror 20 and lens 21 are both mounted to a carriage 22 in such a way that they may be moved as a unit in a direction parallel to the incident laser beam and to the fibre axis. Thus, the focused, deflected beam from the laser is translated along the fibre by movement of the carriage 22 and is aligned in a way such as always to be incident with the same power density on the core of the fibre when the passage of the beam is unblocked by the shutter 19.

When writing the grating, the carriage 22 is first brought to rest in a desired position and the laser beam is passed through the shutter 19, so that a short section of the grating is written into the fibre as a consequence of the interference pattern created by the diffracted UV beam. The pulse energy of the laser beam will typically be in the order of 2 mJ, and the energy density impinging on the fibre core will typically be in the order of 10 mJ/mm². The strength, or depth of refractive index modulation effected by the side writing is proportional to exposure time and a typical exposure time will be around 10 to 50 seconds.

Following the required period of exposure to irradiation, the shutter 19 is closed to block the laser beam and the carriage 22 is moved by distance L, being the period of spaced-apart sections of the grating to be written into the length of the fibre. As stated in the preceding text, the distance L is significantly greater than the period P of the grating itself and typically will be in the order of 1.00 mm. In the case of a phase mask which is etched to provide a centre Bragg wavelength of 1.55 µm, and where the effective refractive index of the grating is 1.46 and the desired spectral separation is 1.0 nm, the distance L will be 0.812 mm by application of the formula provided earlier in this text.

After forward movement of the carriage 22 the shutter 19 is again opened to permit further irradiation of the fibre and this process is repeated until the desired length of grating has been created.

Chirping of the period P of the grating and/or of the modulation period L may be effected during formation of the grating itself by appropriately grooving the phase mask 14. As an alternative approach, chirping may be effected following formation of the grating, for example by use of a procedure involving application of strain differentially along the length of the grating.

Chirping in one or the other the manner described is applied along the full length of the grating.

Figure 8:
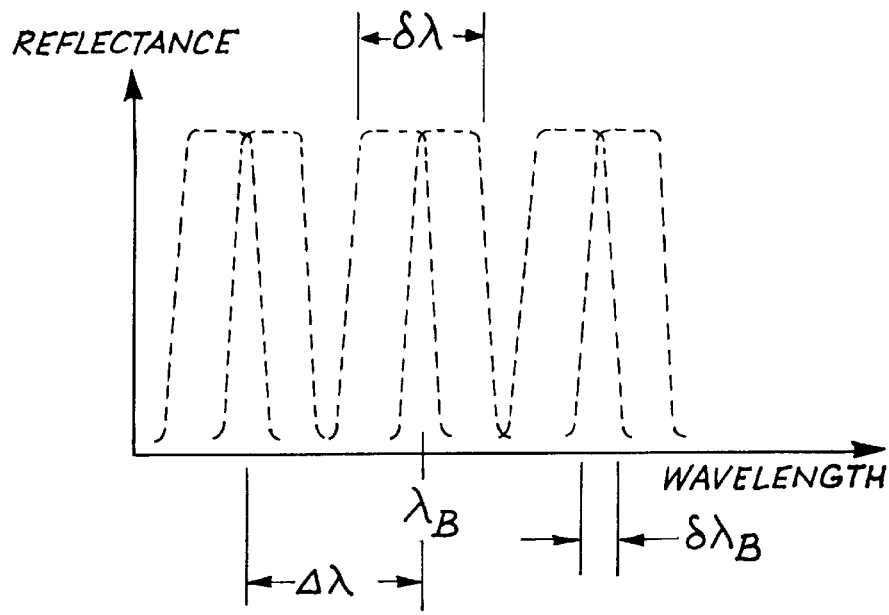
FIG. 8 shows an idealised graphical representation of the spectral response of the grating shown in FIGS. 1 and 2.

FIG. 8 of the drawings shows an idealised graphical representation of the grating that is shown in FIGS. 1 and 2 and which is produced in the manner described above with reference to FIG. 7. The graphical representation is applicable to a grating in which the grating period P is chirped and the modulation period L is maintained substantially constant. In this case identical, expanded reflection peaks having a spectral width $\delta\lambda$ appear at each side of an expanded reflection peak that is centred on the Bragg wavelength $\lambda_B$, with the spacing between the peaks being $\Delta\lambda$.

In the case of a grating having a centre Bragg wavelength $\lambda_B$ of 1.55 µm and having a length in the order of 10 cm, the grating will exhibit a spectral width $\delta\lambda_B$ in the order of 0.01 nm and an expanded ("chirped") spectral width $\delta\lambda$ in the order of 0.5 nm, resulting from a linear chirp of 0.031% applied to the grating period P over the full length of the grating.

The centre spacing $\Delta\lambda$ between adjacent peaks in the spectral responses may be shown to be $\Delta\lambda=\lambda_B^2/2$ nL and typically will be in the order of 1.00 nm in the case of a Bragg wavelength $\lambda_B$ of 1.55 µm and modulation period L=0.8 mm.

Figure 9:
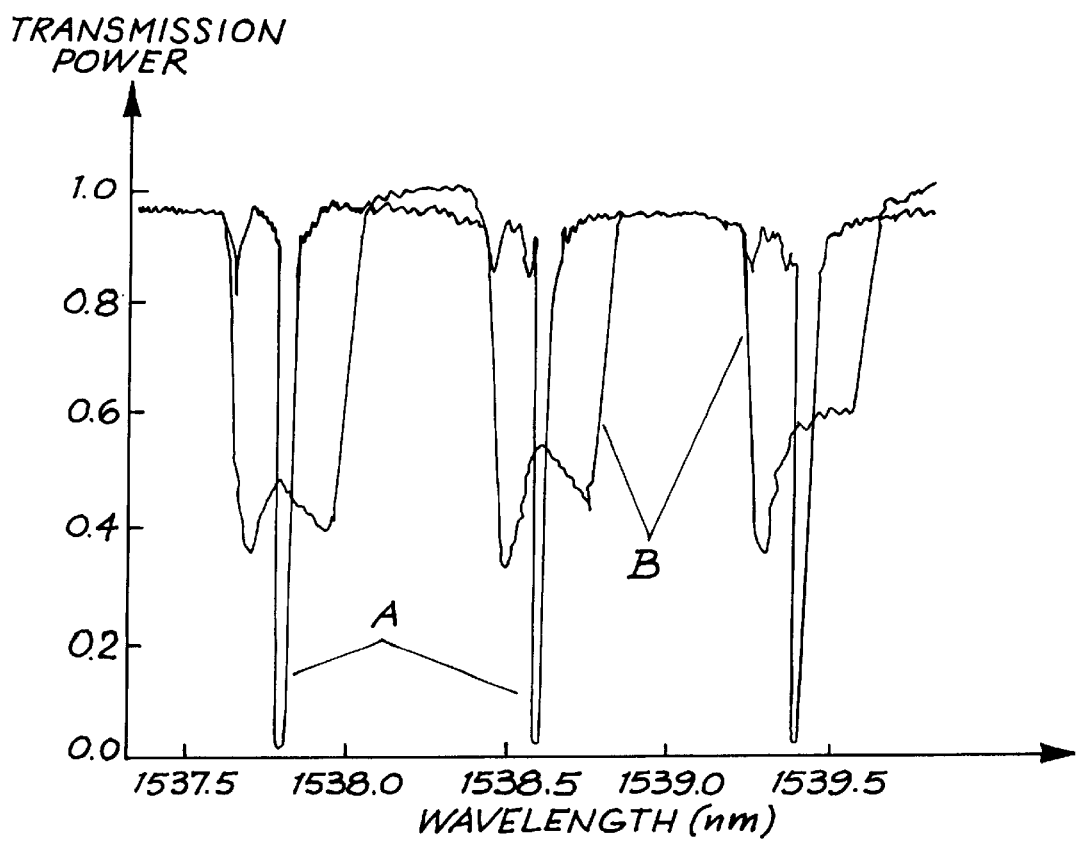
FIG. 9 shows a graphical representation of the spectral response of the grating shown in FIG. 1, in the plot A before chirping and in the plot B after chirping.

FIG. 9 shows a plot of transmission power against wavelengths applicable to a grating that has been fabricated in a hydrogen loaded, boro-germano-silicate optical fibre. A 240 nm, 10 Hz, 2 mJ/pulse beam was focused to a 0.15 mm width by a cylindrical lens with its axis perpendicular to the fibre axis, in the manner described with reference to FIG. 7. The beam was translated along the optical fibre, which was placed directly behind a 14 cm long phase mask, and translation was stopped every 1.0 mm to expose a region of the optical fibre for 40 seconds. The total length of the grating so produced was 100 nm and, although not shown in FIG. 9, the transmission spectrum for the grating shows 15 plus strong reflection peaks with bandwidth of 0.04 nm. The grating was chirped following side writing to produce a linear chirp in the order of 0.03% along the full length of the grating to broaden the reflection peaks. FIG. 9 shows a spectrum of three of the strongest peaks before and after chirping and, apart from some irregularities, attributed to deviations from linear chirp, the peaks are seen all to be broadened to the same bandwidth of 0.36 nm.

Figure 10:
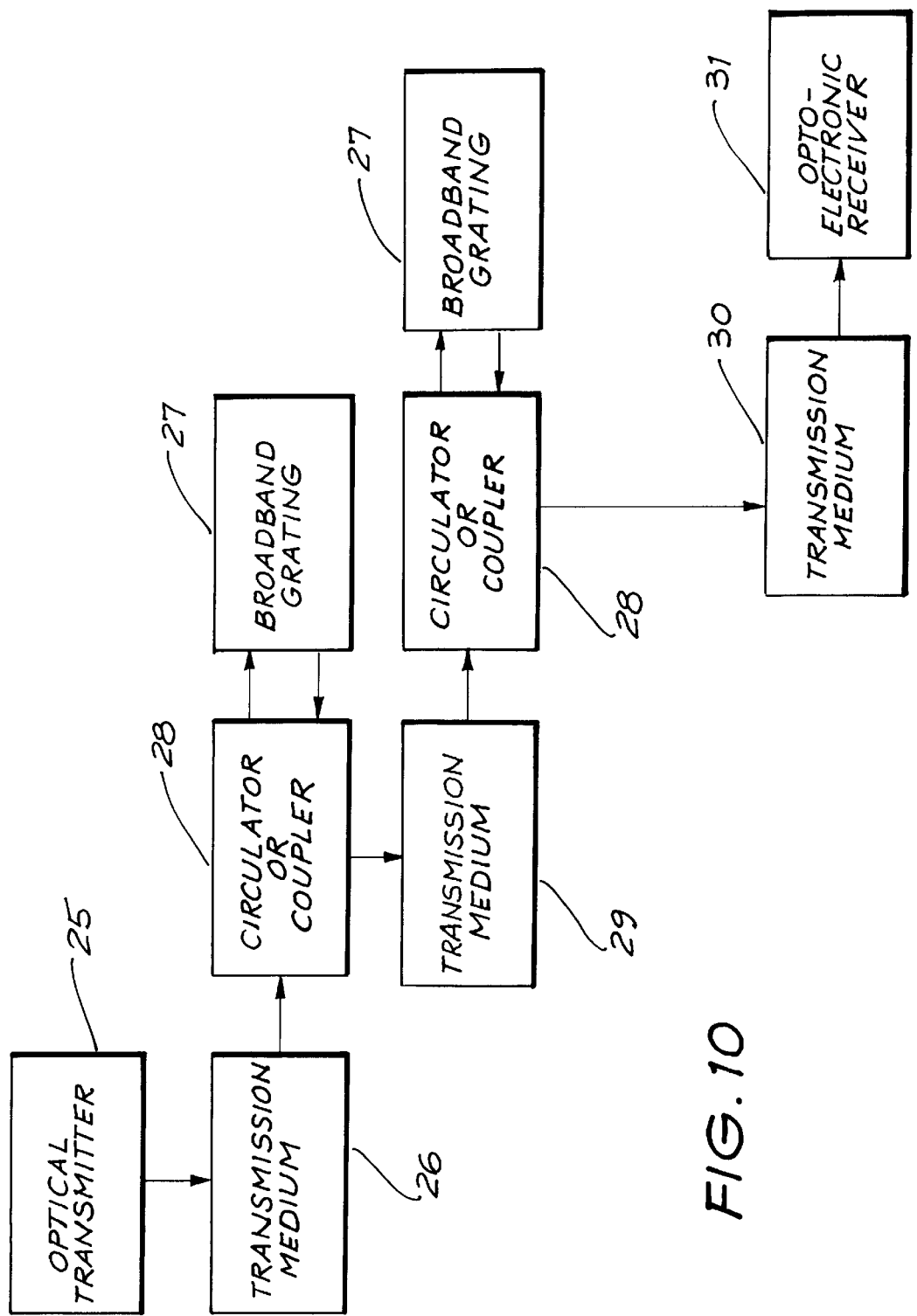
FIG. 10 shows a block diagrammatic representation of an optical communication system that incorporates one or other of the gratings as represented in FIGS. 1 to 6.

FIG. 10 shows a block diagrammatic representation of a communication system in which any one of the above described gratings may be employed for the purpose of processing multiple channels having separation $\Delta\lambda$ and spectral width not greater than $\Delta\lambda$. As illustrated, the system includes an optical transmitter 25 in which multi-channel light outputs are generated with carrier wavelengths $\lambda_1, \lambda_2, ---, \lambda_n$ modulated to bandwidths $\delta\lambda_1, \delta\lambda_2, ---, \delta\lambda_n$ with system information. The output from the transmitter 25 is launched into a first section of what is referred to generally as an optical transmission medium 26 which may include an optical fibre and such other optical components as may be required, for example, to connect, split, filter or amplify the output from the transmitter. A broadband grating 27 of a type as above described is located in circuit with the transmission medium 26 and the grating is selected such that it exhibits broad reflection peaks at wavelengths that coincide with each of the carrier wavelength $\lambda_1, \lambda_2, ---, \lambda_n$, and exhibits reflection peaks having bandwidths greater than that of the bandwidths $\delta\lambda_1, \delta\lambda_2, ---, \delta\lambda_n$. An optical device 28, for example in the form of a circulator or coupler, is located between the transmission medium 26 and the grating 27 for directing the transmitter output into the grating, receiving reflections from the grating and directing the reflected light into a following section of transmitting medium 29.

The above described arrangement is repeated as required for a given system and two repeats of the system are shown in FIG. 10. The output from the final section 30 of the transmission medium is fed to an opto-electronic receiver 31.

What is claimed is:

1. An optical device incorporating a grating structure composed of higher and lower refractive index regions which are positioned periodically with period P, wherein at least one of an amplitude, a phase, and a spatial frequency of the grating structure varies periodically with period L, and wherein at least one of the period L and the period P is chirped continuously over substantially the full extent of the grating structure.

2. A method of producing an optical device incorporating a grating structure, the method comprising the steps of:

producing higher and lower refractive index regions of the grating structure which are positioned periodically with period P;

wherein at least one of an amplitude, a phase, and a spatial frequency of the grating structure is being varied periodically with period L; and wherein at least one of the period L and the period P is being chirped continuously over substantially the full extent of the grating structure.

3. A device as claimed in claim 1, when in the form of a length of optical fibre having a core in which the grating structure is formed.

4. A device as claimed in claim 1, wherein the period P alone is chirped over substantially the full extent of the grating structure and the period L is maintained substantially constant whereby the grating structure exhibits a spectral response in which substantially identical, expanded reflection peaks appear at each side of an expanded reflection peak that is centered on a Bragg wavelength of the grating structure.

5. A device as claimed in claim 1, wherein the period L is chirped over substantially the full extent of the grating structure and the period P is maintained substantially constant whereby the grating structure exhibits a spectral response in which the non-identical, expanded reflection peaks appear at each side of a narrow reflection peak centered on a Bragg wavelength of the grating structure.

6. A device as claimed in claim 1, wherein the period P and the period L are both chirped over substantially the full length of the grating structure whereby the grating structure exhibits a spectral response in which non-identical, expanded reflection peaks appear at each side of a narrow reflection peak centered on a Bragg wavelength of the grating structure.

7. A device as claimed in claim 1, wherein the amplitude of the grating structure varies in the form of a square wave function.

8. The device as claimed in claim 7, wherein the amplitude of the grating structure varies by a full refractive index depth of the grating regions, whereby the grating structure effectively comprises spaced-apart gratin sections having a constant phase relationship.

9. The device as claimed in claim 1, wherein the phase of the grating structure varies periodically by having at least one discontinuity in each of the successive sections of a length of the grating structure effected by an interruption of the alternating high and low refractive index regions in the direction in use, of light propagation through the grating structure.

10. A device as claimed in claim 1, wherein the statical frequency of the grating structure varies periodically effected by a separate chirping of each one of successive sections of the grating structure in the direction in use, of light propagation through the grating structure.

11. A device as claimed in claim 1, wherein at least one of the period P and the period L is chirped linearly over substantially the full extent of the grating structure.

12. A method as claimed in claim 2, wherein the grating is formed within the device in an optical fibre.

13. A method as claimed in claim 2, wherein during formation of the refractive index regions, the amplitude of the high level refractive index regions is modulated with the period L.

14. A method as claimed in claim 2, wherein during formation of the refractive index regions, the phase of the refractive index regions is varied periodically with the period L.

15. A method as claimed in claim 2, wherein during formation of the refractive index regions, a periodicity of the refractive index regions is varied with the period L.

16. A method as claimed in claim 2, wherein the chirping is applied to the grating structure simultaneously with formation of the refractive index regions.

17. A method as claimed in claim 2, wherein the chirping is applied to the grating structure subsequent to formation of the refractive index regions.

18. A device as claimed in claim 1, when incorporated in an optical communication system comprising an optical transmitter which is arranged to transmit light having a center wavelength $\lambda$ and bandwidth $\delta\lambda$, a receiver arranged to receive the transmitted light, and alight transmitting medium connecting the transmitter and the receiver, the grating being located in circuit with the light transmitting medium and the grating being selected such that one of its reflection peaks has a center wavelength that coincides approximately with the transmitter wavelength $\lambda$ and has a bandwidth at least equal to the bandwidth $\delta\lambda$.

19. A device as claimed in claim 18, wherein the optical transmitter comprises one which is arranged to transmit multi-channel light having center wavelengths $\lambda_1, - - - \lambda_n$ and channel bandwidths $\delta\lambda_1, - - - \delta\lambda_n$, wherein the grating is selected such that its reflection peaks coincides approximately with the center wavelengths $\lambda_1, - - - \lambda_n$ and have spectral widths not less than the respective channel bandwidths $\delta\lambda_1, - - - \delta\lambda_n$.

* * * * *